United States Patent [19]
Klaeyle

[11] Patent Number: 5,896,182
[45] Date of Patent: Apr. 20, 1999

[54] AMPLITUDE MODULATOR

[75] Inventor: Philippe Klaeyle, Bretteville, France

[73] Assignee: U.S. Philips Corporation, New York, N.Y.

[21] Appl. No.: 08/661,514

[22] Filed: Jun. 11, 1996

[30] Foreign Application Priority Data

Jun. 14, 1995 [FR] France .................. 95 07083

[51] Int. Cl.⁶ .................. H04N 5/40; H04N 5/62
[52] U.S. Cl. .................. 348/724; 348/737; 332/157; 332/158; 332/159; 332/176
[58] Field of Search .................. 348/724, 737, 348/738, 484, 485; 332/149, 155, 157, 158, 172, 176, 161, 159; 455/218; H04N 5/40, 5/62, 5/60, 7/08

[56] References Cited

U.S. PATENT DOCUMENTS 3,974,460  8/1976  Hongu et al. .................. 332/155
4,168,511  9/1979  Chabanel .................. 348/724
4,263,617  4/1981  Chemin et al. .................. 348/724
4,908,840  3/1990  Kakimoto .................. 332/181
5,515,014  5/1996  Troutman .................. 455/118

OTHER PUBLICATIONS

"A Precise Four-Quadrant Multiplier with Subnanosecond Response" by Barrie Gilbert, IEEE Journal of Solid State Circuits, Vo. SC-3, No. 4, Dec. 1968, pp. 365–373.

Primary Examiner—John K. Peng
Assistant Examiner—Jeffrey Murrell
Attorney, Agent, or Firm—Michael E. Belk

[57] ABSTRACT

Amplitude modulator comprising a differential input pair receiving a modulating input signal, and a Gilbert cell multiplying a carrier signal by the modulating input signal; and a second differential pair of transistors receiving the carrier signal, and the output signal of which is added to the output signal of the Gilbert cell.

6 Claims, 2 Drawing Sheets

AMPLITUDE MODULATOR

BACKGROUND OF THE INVENTION

The present invention relates to an amplitude modulator comprising a differential pair of transistors called differential input pair receiving a modulating input signal, and a Gilbert cell multiplying a signal called carrier signal by the modulating input signal.

The Gilbert cell, which forms the essential part of such a modulator, is known from the document "A Precise Four-Quadrant Multiplier with Subnanosecond Response" by Barrie Gilbert, published in IEEE Journal of Solid State Circuits, Vol. SC-3, No. 4, December 1968.

The circuit presented by Barrie Gilbert, commonly used in amplitude modulators, performs a multiplication of a modulating input signal of the form $Vm(t)=K1. \sin \omega_m t$ by a carrier signal of the form $Vc(t)=K2. \sin \omega_c t$. The differential pair forming the lower stage of the Gilbert cell receives the carrier signal Vc, whereas the differential pairs forming the upper stage of the Gilbert cell receive the modulating input signal after it has been amplified in the differential input pair, to which a DC component called input offset voltage is added which may be realized in various ways, via a supply voltage divider bridge circuit, or, for example, on the basis of a regulated voltage. This input offset voltage performs two essential functions: it permits the amplitude modulator of producing an output signal under any circumstances, even if there is no modulating input signal or if the latter has a zero value. On the other hand, this input offset voltage permits of the production of a signal Vout(t) on the output, which signal contains a component that is proportional to the single carrier signal. The output signal Vout thus has the form of $$Vout(t)=A.(1+K. \sin \omega_m t). \sin \omega_c t,$$

which indeed corresponds to the equation of an amplitude modulated signal.

The input offset voltage itself presents a major drawback. Its value is to be of the same order of magnitude as the amplitude with which the modulating input voltage is varied. Depending on the case, its value may be as little as several millivolts, its value being thus hard to check precisely and in a stable manner, which is highly annoying.

It is an object of the present invention to remedy this drawback by proposing an amplitude modulator in which the input offset voltage is no longer necessary for ensuring the existence of the output signal if there is no input signal, nor for generating on the output a signal whose equation corresponds to that of a modulated signal described above.

SUMMARY OF THE INVENTION

Indeed, according to the present invention, an amplitude modulator of the type defined in the opening paragraph is characterized in that it comprises a differential pair of transistors receiving the carrier signal, the output signal of which differential pair being added to the output signal of the Gilbert cell.

In lieu of adding to the modulating signal DC component which is multiplied by the carrier signal in the Gilbert cell, an amplitude modulator according to the invention adds to the signal that is the result of the multiplication of the modulating signal and the carrier signal a component which is proportional to the single carrier signal.

An amplitude modulator according to the invention thus eliminates the necessity of generating an input offset voltage, because the component coming from the differential pair receiving the carrier signal is always present on the output of the modulator whatever the state of the modulating input signal, and permits of the production of an output signal which contains a component which is proportional to the single carrier signal.

The stability of this component which is proportional to the single carrier signal is improved compared with that obtained in the present state of the art, for it depends only on parameters (current sources, emitter degeneration resistors of the transistors that form the differential pair) of which a parasitic variation would be uniform for the whole circuit; the proportions between the various signals would thus be maintained.

A variant of the invention presents an amplitude modulator as described above, characterized in that it comprises switches which permit of the disconnection of the differential input pair from the rest of the amplitude modulator.

Such a variant of the invention makes it possible to stop the amplitude modulation without necessarily canceling the modulating input signal of. Thus, the output signal of the modulator only presents the component that is proportional to the single carrier signal. An easy observation of the carrier signal for the purpose of examination is thus made possible.

This device makes it also possible to choose between an amplitude modulation of the carrier and a frequency modulation, the latter being realized in that the modulating signal influences the device that generates the carrier signal by another way.

The invention likewise relates to an apparatus for converting data into signals having a TV-standard compatible form, comprising:

- a unit, called entry unit, which receives the data and produces signals of two different kinds, one called audio signal, the other called video signal,
- an audio signal processing module featuring one input and one output, which module includes and oscillator which provides a frequency-turnable output signal,
- a video signal processing module featuring one input and one output,
- an adder featuring two inputs and one output, which adder performs a superposition of the signals which are available at the outputs of the audio and video signal processing modules.
- a mixer enabling the tuning to a nominal frequency of the frequency of the signal which is available at the output of the adder, characterized in that the audio signal processing module comprises an amplitude modulator as described above, amplitude modulator for which the modulating signal is constituted by the audio signal produced by the entry unit, amplitude modulator for which the carrier signal is constituted by the output signal of the oscillator, amplitude modulator whose output signal constitutes the output of the audio signal processing module.

BRIEF DESCRIPTION OF THE DRAWINGS

These and other aspects of the invention will be apparent from and elucidated with reference to the embodiments described hereinafter.

In the drawings.

DESCRIPTION OF PREFERRED EMBODIMENTS

Figure 1:
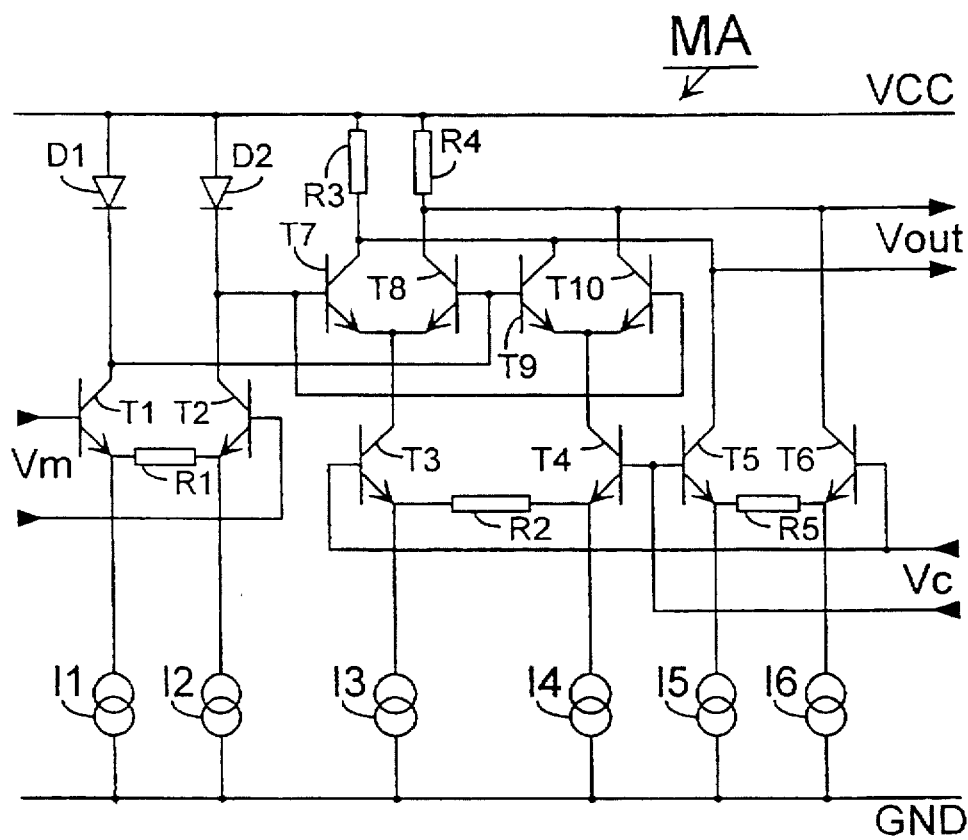
FIG. 1 represents a diagram describing an amplitude modulator according to the invention.

As shown in FIG. 1, an amplitude modulator according to the invention comprises a differential input pair, formed by transistors T1 and T2, receiving a modulating input signal Vm which has the form $Vm(t)=K1 \cdot \sin \omega_m t$, and a Gilbert cell formed by transistors T3, T4, T7, T8, T9, T10 which performs the multiplication of the carrier signal by the modulating input signal, which carrier signal has the form $Vc(t)=K2 \cdot \sin \omega_c t$.

The differential pair forming the lower stage of the Gilbert cell (transistors T3 and T4) receives the carrier signal Vc, whereas the differential pairs forming the upper stage of the Gilbert cell (transistors T7, T8 and T9, T10) receive the modulating input signal after it has been processed in the differential input pair. An additional differential pair formed by the transistors T5 and T6 receives the carrier signal. The output signal Vout of the modulator is the sum of the output signal of this additional differential pair and the output signal of the Gilbert cell.

If V1 is the output signal of the Gilbert cell, one has $V1(t)=K3 \cdot \sin \omega_m t \cdot \sin \omega_c t$. If V2 is the output signal of the additional differential pair receiving the carrier signal, one has $V2(t)=K4 \cdot \sin \omega_c t$. The modulator output signal Vout of the modulator MA is the sum of these two signals and is thus presented in the form of $Vout(t)=A' \cdot (1+K' \cdot \sin \omega_m t) \cdot \sin \omega_c t$, which indeed corresponds well to the equation of an amplitude-modulated signal.

Figure 2:
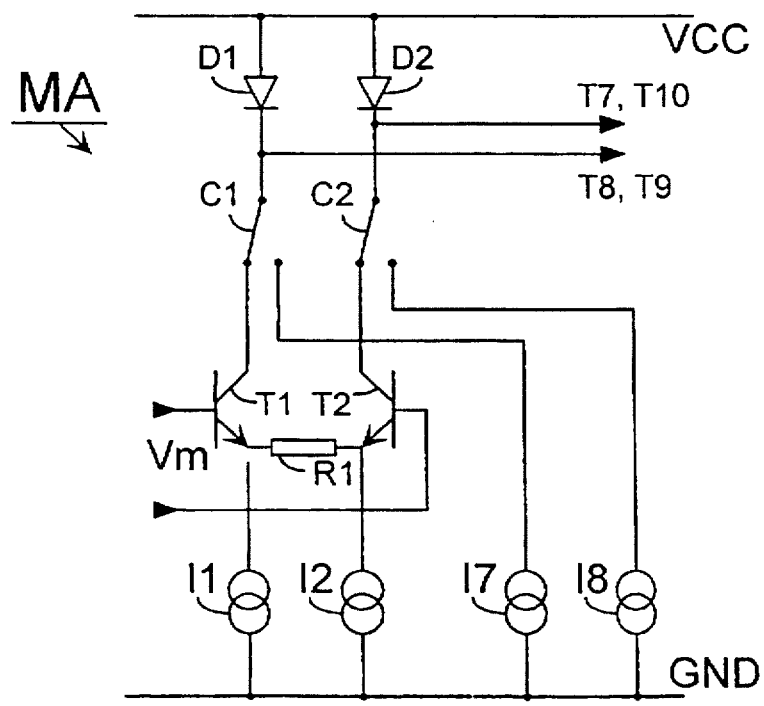
FIG. 2 represents a diagram which describes the input stage receiving the modulating input signal according to a variant of the invention.

FIG. 2 shows a variant of the invention according to which an amplitude modulator comprises switches which permit of the disconnection of the differential input pair from the rest of the amplitude modulator. These switches may be realized in various manners, for example, by transistors. Such a variant of the invention makes it possible to stop the modulation without necessarily canceling the modulating input signal of, by connecting the bases of the transistors T7, T8, T9 and T10 to current sources I7, I8 whose outputs have the same potential. Thus, the output signal of the modulator presents only the component that is proportional to the single carrier signal:

$Vout(t)=A' \cdot \sin \omega_c t$.

An easy observation of the carrier signal for the purpose of examination is thus made possible.

Figure 3:
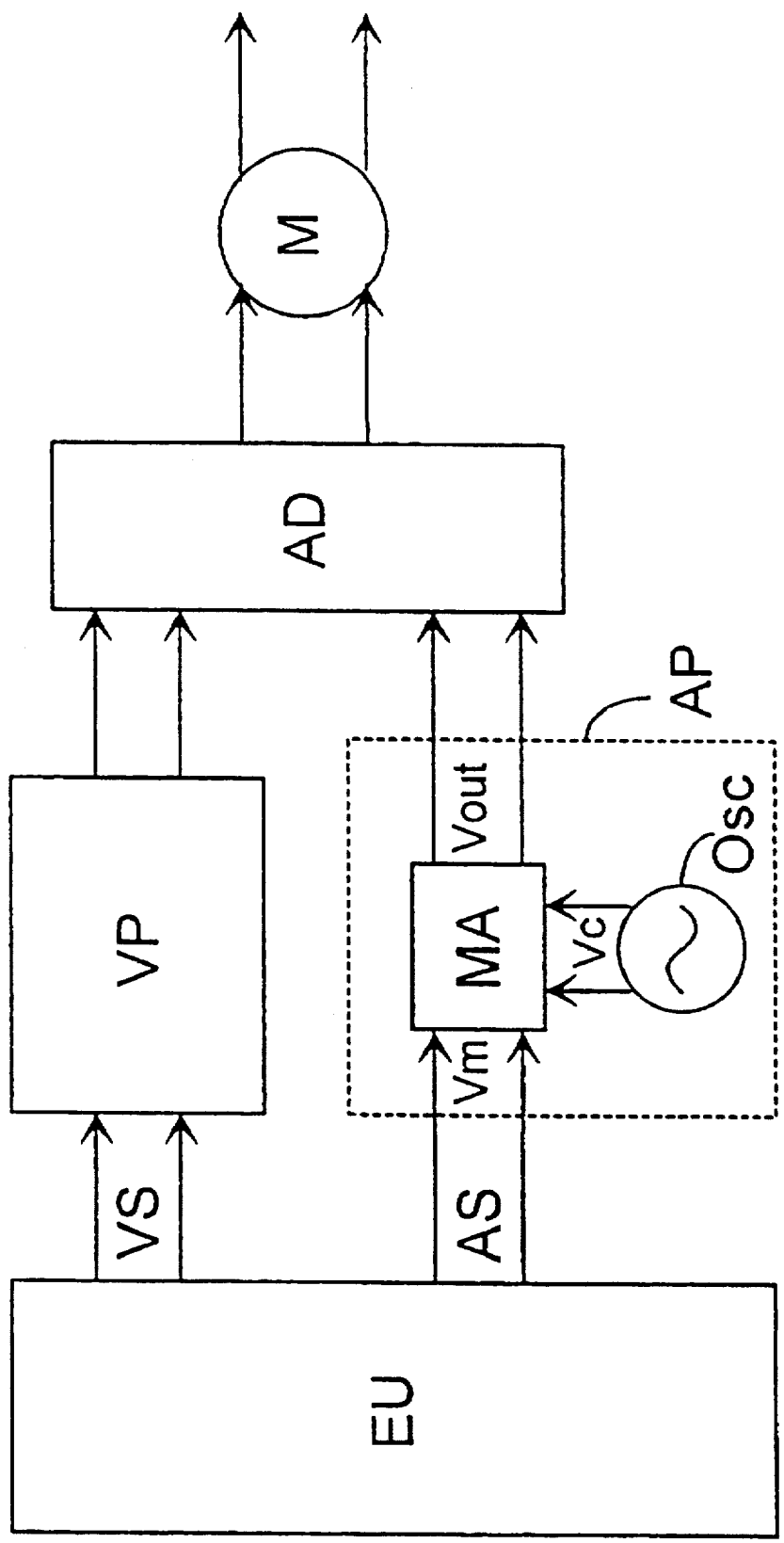
FIG. 3 represents an apparatus for converting data into signals having a TV-standard compatible form in which an amplitude modulator according to the invention is used.

FIG. 3 shows an apparatus for converting data into signals having a TV-standard compatible form, comprising:

- a unit EU, called entry unit, which receives the data and produces signals of two different kinds, one called audio signal AS, the other called video signal VS,
- an audio signal processing module AP featuring one input and one output, which module AP includes an oscillator Osc which provides a frequency-tunable output signal,
- a video signal processing module VP featuring one input and one output,
- an adder AD featuring two inputs and one output, which adder AD performs a superposition of the signals which are available at the outputs of the audio and video signal processing modules,
- a mixer M enabling the tuning to a nominal frequency of the frequency of the signal which is available at the output of the adder, characterized in that the audio signal processing module comprises an amplitude MA as described above, amplitude modulator MA for which the modulating signal Vm is constituted by the audio signal produced by the entry unit EU, amplitude modulator MA for which the carrier signal Vc is constituted by the output signal of the oscillator Osc, amplitude modulator MA whose output signal constitutes the output of the audio signal processing module AP.

What is claimed is:

1. Amplitude modulator comprising a differential input pair of transistors receiving a modulating input signal, and a Gilbert cell multiplying a carrier signal by the modulating input signal, and further comprising a second differential pair of transistors receiving the carrier signal and having an output signal which output signal is added to the output signal of the Gilbert cell.

2. Amplitude modulator as claimed in claim 1, further comprising switches which permit of the disconnection of the differential input pair from the rest of the amplitude modulator.

3. Amplitude modulator as claimed in claim 2, characterized in that the switches which permit of the disconnection are realized by transistors.

4. Apparatus for converting data into signals having a TV-standard compatible form, comprising:

- an entry unit, which receives the data and produces signals of two different kinds, one called audio signal, the other called video signal;
- an audio signal processing module featuring one input and one output, which module includes an oscillator which provides a frequency-tunable output signal;
- video signal processing module featuring one input and one output;
- an adder featuring two inputs and one output, which adder performs a superposition of the signals which are available at the outputs of the audio and video signal processing modules;
- a mixer enabling the tuning to a nominal frequency of the frequency of the signal which is available at the output of the adder;

wherein the audio signal processing module includes:

a differential input pair of transistors receiving a modulating input signal, a Gilbert cell multiplying a carrier signal by the modulating input signal, and a second differential pair of transistors receiving the carrier signal and having an output signal which is added to the output signal of the Gilbert cell, and for which the modulating signal is constituted by the audio signal produced by the entry unit, the carrier signal is constituted by the output signal of the oscillator, and the output signal constitutes the output of the audio signal processing module.

5. The apparatus of claim 4, in which the audio signal processing module further includes switches which permit the disconnection of the differential input pair from the rest of the audio signal processing module.

6. The apparatus of claim 5, in which the switches which permit the disconnection include transistors.

* * * * *